(12) United States Patent
Yamato

(10) Patent No.: US 7,205,700 B2
(45) Date of Patent: Apr. 17, 2007

(54) METHOD OF PRODUCING SURFACE ACOUSTIC WAVE DEVICE AND THE SURFACE ACOUSTIC WAVE DEVICE

(75) Inventor: Shuji Yamato, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 191 days.

(21) Appl. No.: 10/930,231

(22) Filed: Aug. 30, 2004

(65) Prior Publication Data

US 2005/0071971 A1    Apr. 7, 2005

(30) Foreign Application Priority Data

Oct. 3, 2003    (JP)    ............... 2003-345779

(51) Int. Cl.
*H03H 9/25*    (2006.01)
(52) U.S. Cl. ................. 310/313 B; 310/365; 310/366; 29/25.35
(58) Field of Classification Search ............ 310/313 D, 310/313 R, 313; 333/193; 29/25.35
See application file for complete search history.

(56) References Cited

U.S. PATENT DOCUMENTS

| | | | |
|---|---|---|---|
| 4,736,128 | A | 4/1988 | Takoshima et al. |
| 6,792,656 | B2 * | 9/2004 | Shimoe et al. ............. 29/25.35 |
| 6,852,607 | B2 * | 2/2005 | Song et al. ................. 438/464 |
| 2001/0029650 | A1 | 10/2001 | Norihiko et al. |
| 2002/0074904 | A1 | 6/2002 | Watanabe et al. |
| 2003/0151329 | A1 | 8/2003 | Kadota et al. |
| 2003/0174028 | A1 * | 9/2003 | Takayama et al. .......... 333/193 |
| 2004/0140734 | A1 * | 7/2004 | Nakao et al. ............ 310/313 R |
| 2004/0164644 | A1 * | 8/2004 | Nishiyama et al. ..... 310/313 A |

FOREIGN PATENT DOCUMENTS

| | | |
|---|---|---|
| EP | 1 330 026 A1 | 7/2003 |
| JP | 10-163789 | * 6/1998 |
| JP | 2001-358550 | 12/2001 |
| JP | 2002-141762 | 5/2002 |
| JP | 2002-152002 | 5/2002 |
| JP | 2002-299985 | 10/2002 |
| JP | 2002-374137 | 12/2002 |

OTHER PUBLICATIONS

Official Communication issued in the corresponding Korean Application No. 10-2004-0078234, mailed on Jun. 28, 2006.
European Official Communication issued on Sep. 7, 2005 in the corresponding European Application No. 04292343.3.

* cited by examiner

*Primary Examiner*—Darren Schuberg
*Assistant Examiner*—J. Aguirrechea
(74) *Attorney, Agent, or Firm*—Keating & Bennett, LLP

(57) ABSTRACT

A method of producing a surface acoustic wave device includes the steps of forming a first electrode film for constituting an interdigital electrode, a wiring electrode, and an electrode pad on the piezoelectric substrate, forming an insulation film on the piezoelectric substrate so as to cover the first electrode film, patterning the insulation film so that the insulation film existing on the portion of the first electrode film onto which a second electrode film is to be laminated is removed, forming the second electrode film on the portion of the first electrode film from which the insulation film has been removed, and bonding a bump onto the second electrode film.

17 Claims, 9 Drawing Sheets

METHOD OF PRODUCING SURFACE ACOUSTIC WAVE DEVICE AND THE SURFACE ACOUSTIC WAVE DEVICE

BACKGROUND OF THE INVENTION

1. Field of the Invention

The present invention relates to a method of producing a surface acoustic wave device which is packaged by a flip-chip bonding method, and in particular, the present invention relates to a method of producing a surface acoustic wave device in which an electrode is provided on a piezoelectric substrate, the electrode having a portion thereof in which plural electrode layers are laminated, and an insulation layer is formed so as to cover the electrode, and also relates to the surface acoustic wave device.

2. Description of the Related Art

Different types of surface acoustic wave devices, which are mounted onto packages by a flip-chip bonding method, have been proposed. In some of the surface acoustic wave devices, a portion of the electrode has a structure in which plural electrode layers are laminated to each other. For example, in some cases, in a wiring electrode in contact with an interdigital electrode, plural electrode layers are laminated to each other in order to reduce the resistance. Moreover, in some cases, an electrode pad in contact with the wiring electrode has a structure in which plural electrode layers are laminated to each other, so that an impact against a substrate occurring during bump-bonding can be relaxed. Moreover, in some cases, the bus bar of an interdigital electrode has a structure in which plural electrode layers are laminated to each other. Thereby, the confinement effect is enhanced, the insertion loss is reduced, and the pass bandwidth is increased.

Moreover, in some cases, in these types of surface acoustic wave devices, an insulation film made of $SiO_2$, SiN, or the like is formed so as to cover the electrodes except for the bump-bonding portion for the protection of the electrodes and the frequency-adjustment.

Japanese Patent No. 3435639 (Patent Document 1) describes an example of the above-described methods of producing surface acoustic wave devices. The method of producing a surface acoustic wave device of Patent Document 1 will be described with reference to FIGS. 6A, 6B, 6C, 7A, 7B, and 7C.

First, a first electrode layer 102 is formed on a piezoelectric substrate 101, as shown in FIG. 6A. Subsequently, a second electrode film 103 is formed on the first electrode layer 102, as shown in FIG. 6B. The second electrode layer 103 is formed on a portion of the upper surface of the first electrode layer 102, not on the entire upper surface thereof. That is, the second electrode layer 103 is provided only in the area where the above-described electrode pad, wiring electrode, and bus bar are to be formed. Thus, a wiring electrode 104, an electrode pad 105, and a bus bar 106 are formed in which the first and second electrode layers are laminated to each other. An electrode layer 107 is a part constituting an electrode finger of the interdigital electrode. Thus, the electrode finger constituting part 107 is composed of the first electrode layer 102 only.

Subsequently, a bump 108 is bonded onto the electrode pad 105 as shown in FIG. 6C.

Then, an insulation film 109 made of $SiO_2$ is wholly formed thereon, as shown in FIG. 7A. Then, the insulation film 109 is etched so that the bump 108 is exposed as shown in FIG. 7B. Moreover, the insulation film 109 is etched so as to have a reduced thickness as shown in FIG. 7C. Thus, the frequency characteristic is adjusted.

Moreover, Japanese Unexamined Patent Application Publication No. 10-163789 (Patent Document 2) discloses a method of producing a surface acoustic wave device which is different from one described in Patent Document 1. The surface acoustic wave device disclosed in Patent Document 2 will be described with reference to FIGS. 8A to 8C and 9A to 9C.

First, a first electrode layer 202 is formed on a piezoelectric substrate 201, as shown in FIG. 8A. Subsequently, a second electrode layer 203 is formed on the first electrode layer 202, as shown in FIG. 8B.

The second electrode layer 203 is provided only in the area where an electrode pad, a wiring electrode, and a bus bar are to be formed.

Thus, a wiring electrode 204, an electrode pad 205, and a bus bar 206 are formed. An electrode layer 207 corresponds to a portion constituting an electrode finger of an interdigital electrode.

Then, as shown in FIG. 8C, an insulation film 208 made of $SiO_2$ is laminated on the entire surface. Subsequently, as shown in FIG. 9A, the portion of the insulation film 208 existing on the electrode pad 205 is removed by etching. Then, as shown in FIG. 9B, the insulation film 208 is etched so as to have a reduced thickness. Thus, the frequency characteristic is adjusted. Finally, a bump 209 is bonded onto the electrode pad 205.

Referring to the production method described in Patent Document 1, immediately after the electrode pad 105 is formed, the bump 108 is bonded to the upper surface of the portion of the second electrode layer 103 constituting the electrode pad 105. Accordingly, the bonding strength between the electrode pad 105 and the bump 108 can be sufficiently enhanced. However, after the bump 108 is formed, the insulation film 109 is formed so that the bump 108 is covered. As shown in FIG. 7C, the insulation film 109 existing on the bump 108 is removed. However, problems occur in that, in flip-chip bonding, the bonding strength between the bump 108 and an electrode of the package may be reduced, due to the residues of the insulation film on the bump 108.

Moreover, referring to the production method described in Patent Document 2, the insulation film 208 is formed immediately after the electrode pad 205 is formed. The insulation film 208 existing on the electrode pad is removed. Thereafter, the bump 209 is formed on the electrode pad 205. Accordingly, possibly, the bonding strength between the electrode pad 205 and the bump 209 is reduced, due to the residues of the insulation film.

SUMMARY OF THE INVENTION

In order to overcome the problems described above, preferred embodiments of the present invention provide a method of producing a surface acoustic wave device which includes a bump and an insulation film, and is mounted on a package by a flip-chip technique, and in which the bonding strength between the bump and the electrode pad is sufficiently high, and the bonding strength between the bump and an electrode on the package side is prevented from decreasing, and also provide a surface acoustic wave device.

According to a first preferred embodiment of the present invention, a method of producing a surface acoustic wave device in which an electrode including an interdigital electrode, a wiring electrode in contact with the interdigital electrode, and an electrode pad connected to the wiring electrode is formed on a piezoelectric substrate, at least the electrode pad has a structure in which plural electrode layers are laminated to each other, and a bump is bonded to the electrode pad, the method including the steps of forming a first electrode film for constituting the interdigital electrode, the wiring electrode, and the electrode pad on the piezoelectric substrate, forming an insulation film on the piezoelectric substrate so as to cover the first electrode film, patterning the insulation film so that the insulation film existing on the portion of the first electrode film onto which a second electrode film is to be laminated is removed, and forming the second electrode film on the portion of the first electrode film from which the insulation film has been removed, and bonding a bump onto the second electrode film. Thus, the bump is bonded directly to the second electrode layer. Therefore, the bonding strength between the electrode and the bump can be significantly enhanced. Moreover, no insulation film is formed on the bump after the bump is formed. Therefore, the bonding strength between the bump and an electrode on the package side is prevented from decreasing, which will occur due to the residues of the insulation film.

Before the second electrode film is formed on the first electrode film, the insulation film existing on the portion of the first electrode film onto which the second electrode film is to be formed is removed. The first and second electrode films are preferably formed by a thin-film forming method or other suitable process. Therefore, although the insulation film on the first electrode film is removed and the second electrode film is formed thereon, the bonding strength between the first and second electrode films is sufficiently high.

According to preferred embodiments of the present invention, in a surface acoustic wave device to be mounted onto a package by flip-chip bonding using a bump, the electrical connection strength between the bump and the electrode pad and also the bonding strength between the bump and an electrode on the package side are sufficiently enhanced.

Preferably, the portion of the first electrode film onto which the second electrode film is to be laminated includes portions for constituting the electrode pad, the wiring electrode, and the bus bar of the interdigital electrode. Accordingly, the substrate is prevented from cracking when the bump is bonded thereto. The wiring electrode has a low resistance, and a surface acoustic wave can be effectively confined between the bus bars of the interdigital electrode.

According to a second preferred embodiment of the present invention, a method of producing a surface acoustic wave device in which an electrode including an interdigital electrode, a wiring electrode in contact with the interdigital electrode, and an electrode pad connected to the wiring electrode is formed on a piezoelectric substrate, at least the electrode pad has a structure in which plural electrode layers are laminated to each other, and a bump is bonded to the electrode pad, the method including the steps of forming a first electrode film for constituting at least the interdigital electrode and the wiring electrode on a piezoelectric substrate, forming an insulation film on the piezoelectric substrate so as to cover the first electrode film, patterning the insulation film so that the insulation film existing on the portion of the first electrode film on which a second electrode film is to be laminated, and also, the insulation film existing on the portion of the piezoelectric substrate onto which the second electrode film for constituting the electrode pad is to be formed are removed, forming the second electrode film on the portion of the first electrode film from which the insulation film has been removed and on the portion of the piezoelectric substrate onto which the second electrode film is to be formed, and bonding a bump onto the second electrode film constituting the electrode pad. Thus, no residues of the insulation film are formed on the electrode film constituting the electrode pad, so that the bonding strength between the electrode pad and the bump can be effectively enhanced. According to preferred embodiments of the present invention, the electrode pad may be formed of the second electrode film, not having a structure where the first and second electrode films are laminated, in contrast to the interdigital electrode and the wiring electrode.

Preferably, the method further includes a step of reducing the thickness of the insulation film for frequency-adjustment after the insulation film is patterned. Thus, the surface acoustic wave device has a desired frequency characteristic.

Preferably, an $SiO_2$ film or an SiN film is formed as the insulation film. The electrode is protected by the $SiO_2$ film or the SiN film, and moreover, the temperature characteristic can be improved.

Preferably, as an underlying layer for the second electrode film, an adhesion electrode layer for enhancing the adhesion between the first electrode film and the second electrode film is formed, and the second electrode film is formed on the adhesion electrode layer. Thus, the adhesion between the first and second electrode layers is effectively enhanced.

Preferably, as an underlying layer for the first electrode film, an underlying electrode layer for enhancing the adhesion between the piezoelectric substrate and the electrode is formed, and the first electrode film is formed on the underlying electrode layer. Thus, the bonding strength between the electrode and the piezoelectric substrate can be significantly increased.

According to another preferred embodiment of the present invention, a surface acoustic wave device includes a piezoelectric substrate, an electrode disposed on the piezoelectric substrate and including an interdigital electrode, a wiring electrode connected to the interdigital electrode, and an electrode pad, a bump bonded to the electrode pad, a portion of the electrode including at least the electrode pad having a structure in which plural electrode films are laminated, and an insulation film arranged so as to cover an area except for the portion of the electrode having a structure where the plural electrode films are laminated. Thus, the interdigital electrode is protected. The frequency-adjustment can be carried out by the adjustment of the thickness of the insulation film. Thus, the reliability is high, and the acceptance ratio of the characteristic is greatly improved.

Other features, elements, steps, characteristics and advantages of the present invention will become more apparent from the following detailed description of preferred embodiments with reference to the attached drawings.

DETAILED DESCRIPTION OF PREFERRED EMBODIMENTS

Hereinafter, the present invention will be made clearer from the following description of preferred embodiments of the present invention made with reference the drawings.

A production method according to a preferred embodiment of the present invention is described with reference to FIGS. 1A to 1D, 2A, and 2B.

Figure 1A:
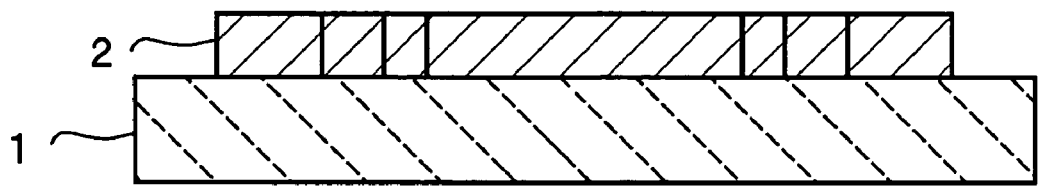
FIGS. 1A, 1B, 1C, and 1D are sectional views showing a method of producing a surface acoustic wave device according to a preferred embodiment of the present invention.

First, as shown in FIG. 1A, a piezoelectric substrate 1 is prepared. A first electrode film 2 is formed on the piezoelectric substrate 1. The first electrode film 2 is preferably made of an electro-conductive material such as Al, Cu, Au, Pt, or Ti. For the formation of the first electrode film 2, a metal film is formed by an appropriate method such as vapor deposition, sputtering, or plating, or other suitable process, and then, the metal film is patterned by a photolithographic technique. It is to be noted that when the metal film is patterned by the photolithographic technique and then etching, as an etching method, wet etching and dry etching using plasma or other suitable process can be used. Moreover, the first electrode film 2 may be formed by a lift-off method.

The first electrode film 2 is preferably formed so as to constitute at least an interdigital electrode, a wiring electrode, and an electrode pad. That is, the first electrode film 2 is arranged in order to form various electrode portions on the piezoelectric substrate 1.

Figure 1B:
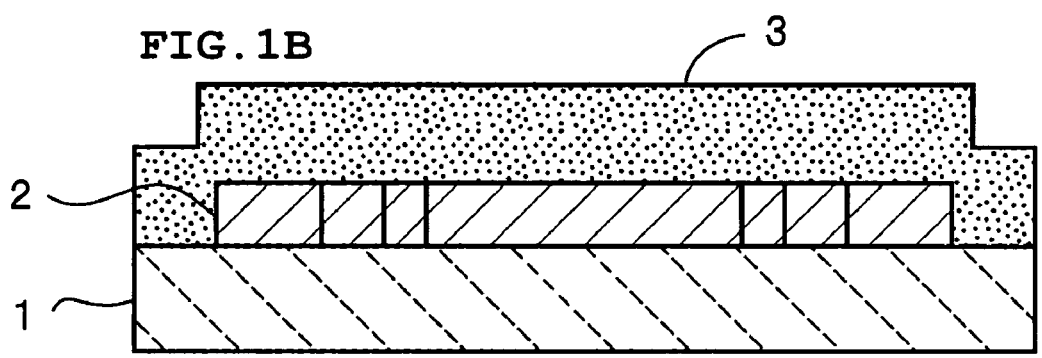

Thereafter, as shown in FIG. 1B, an insulation film 3 is formed so as to cover the entire upper surface 1a of the piezoelectric substrate 1. As the insulation film 3, insulation films made of various insulating materials such as $SiO_2$, AlN, $Al_2O_3$, SiN and so forth may be used. The formation of the insulation film 3 can be performed by an appropriate method such as sputtering or other suitable process.

The insulation film 3 functions as a protecting film in the surface acoustic wave device. Further, the insulation film 3 is provided in order to perform the frequency-adjustment according to this preferred embodiment.

Figure 1C:
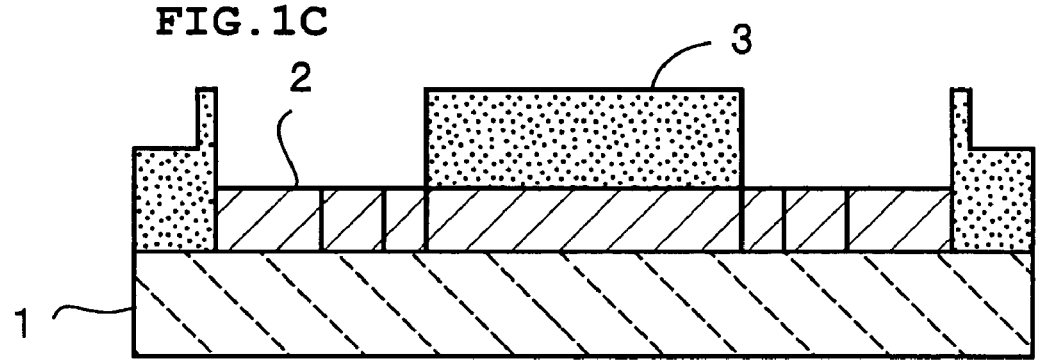
Figure 1D:
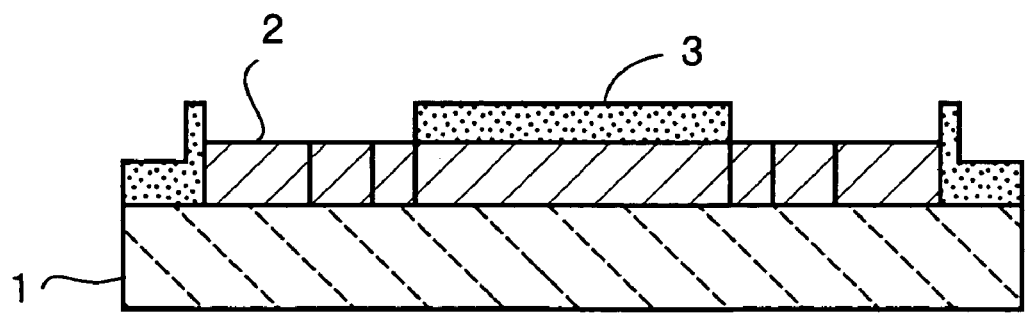

Subsequently, as shown in FIG. 1C, the insulation film 3 is patterned. The patterning is carried out so that the portion of the insulation film 3 in which a second electrode film, described below, is to be laminated on the first electrode film 2 is removed. For example, a positive-type resist is provided on the whole surface of the insulation film 3. Then, a mask having an opening which corresponds to the portion of the insulation film to be removed is laminated onto the resist, followed by exposure. The exposed portion of the resist is removed. The portion of the insulation film where the second electrode film is to be formed is removed. Thereafter, the remaining resist is removed. Moreover, in the photolithographic technique, the portion of the insulation film may be removed by stepper exposure using a reticle.

After the insulation film 3 is patterned as described above, the frequency characteristic of the surface acoustic wave device is measured. For frequency-adjustment, the thickness of the insulation film 3 is reduced by etching based on the measurement results (see FIG. 1D). As an etching method for the insulation film 3, wet type etching and dry type etching using plasma or other process can be used. In the case in which the frequency-adjustment is not necessary, the process of reducing the thickness of the insulation film 3 may be omitted.

Figure 2A:
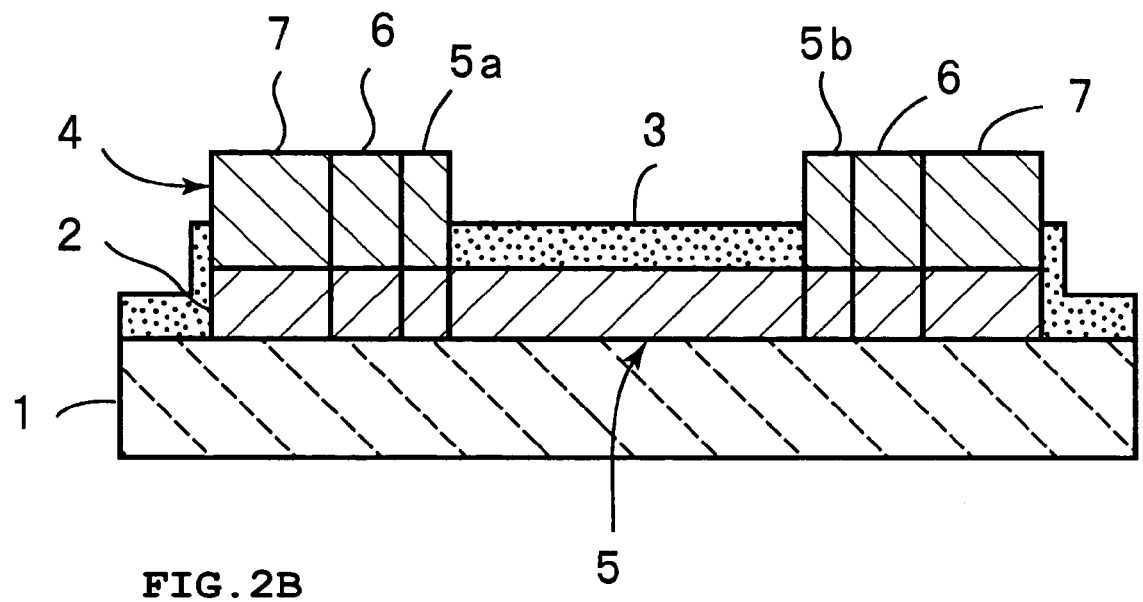
FIGS. 2A and 2B are front section views showing a method of producing a surface acoustic wave device according to a preferred embodiment of the present invention.

Subsequently, as shown in FIG. 2A, a second electrode film 4 is formed on the exposed portion of the first electrode film 2. The second electrode film 4 is formed on the portion of the first electrode film 2 that corresponds to the bus bars 5a and 5b of an interdigital electrode 5, a wiring electrode 6, and an electrode pad 7. That is, the bus bars 5a and 5b, the wiring electrode 6, and the electrode pad 7 each have a structure in which the first and second electrode films are laminated to each other.

An electrode finger 5c of the interdigital electrode 5 is preferably formed of the first electrode film 2 only.

The second electrode film 4 is formed with an appropriate electro-conductive material such as Al, Cu, Au, Ti, or other suitable material. The forming method for the second electrode film 4 is not particularly limited. The second electrode layer 4 can be provided by an appropriate method, i.e., by forming a metal film to become the second electrode film on the whole surface, and patterning by wet or dry etching or by a method using lithography.

Since the second electrode film 4 is formed, an impact occurring when a bump is bonded to the electrode pad 7, can be relaxed, and chipping of the piezoelectric substrate which occurs due to a stress applied to the bump at flip-chip bonding can be prevented. Moreover, the resistance of the wiring electrode 6 can be decreased, and the confinement effect for a surface acoustic wave in the bus bar 5 can be enhanced.

Figure 2B:
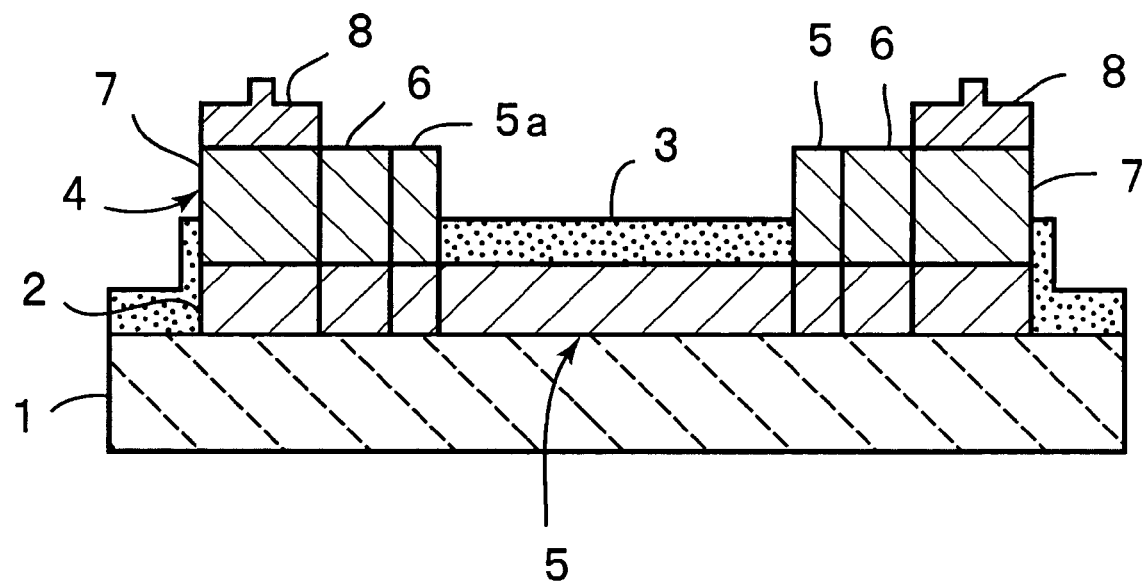

Thereafter, as shown in FIG. 2B, a bump 8 is bonded to the electrode pad 7. The bump 8 may be made of an appropriate electroconductive material such as Au, solder, or other suitable material.

According to this preferred embodiment, the bump 8 is preferably bonded directly to the upper surface of the second electrode film 4. Therefore, the bonding strength between the bump 8 and the electrode pad 7 is greatly increased. In the surface acoustic wave device produced as described above, no residues of the insulation film occur on the surface of the bump 8. Thus, the bonding strength between the bump 8 and an electrode land of a substrate on the package side can be greatly increased.

FIGS. 1A to 1D, 2A, and 2B show the portion of the surface acoustic wave device in which one interdigital electrode, the wiring electrodes in contact with the interdigital electrode, and the electrode pads are formed. According to the present invention, the electrode structure formed on the piezoelectric substrate is not particularly limited. The present invention may be applied to the production of various surface acoustic wave resonators and surface acoustic wave devices. For example, the present invention can be suitably applied to the formation of a ladder type filter shown in FIGS. 3 and 4.

Figure 3:
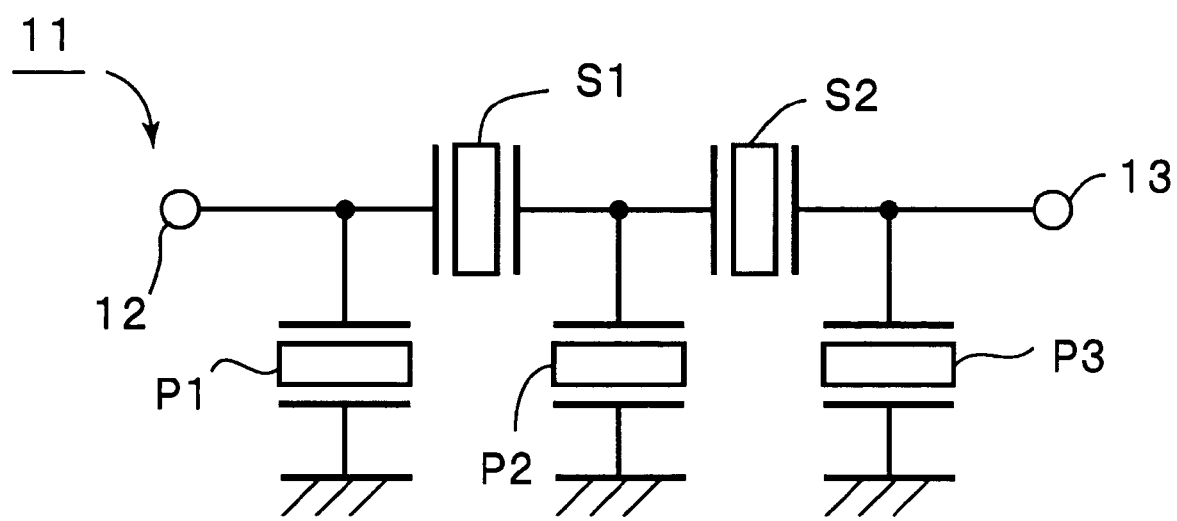
FIG. 3 is a circuit diagram of a ladder type filter as a surface acoustic wave device to which the method of producing a surface acoustic wave device according to a preferred embodiment of the present invention is applied.
Figure 4:
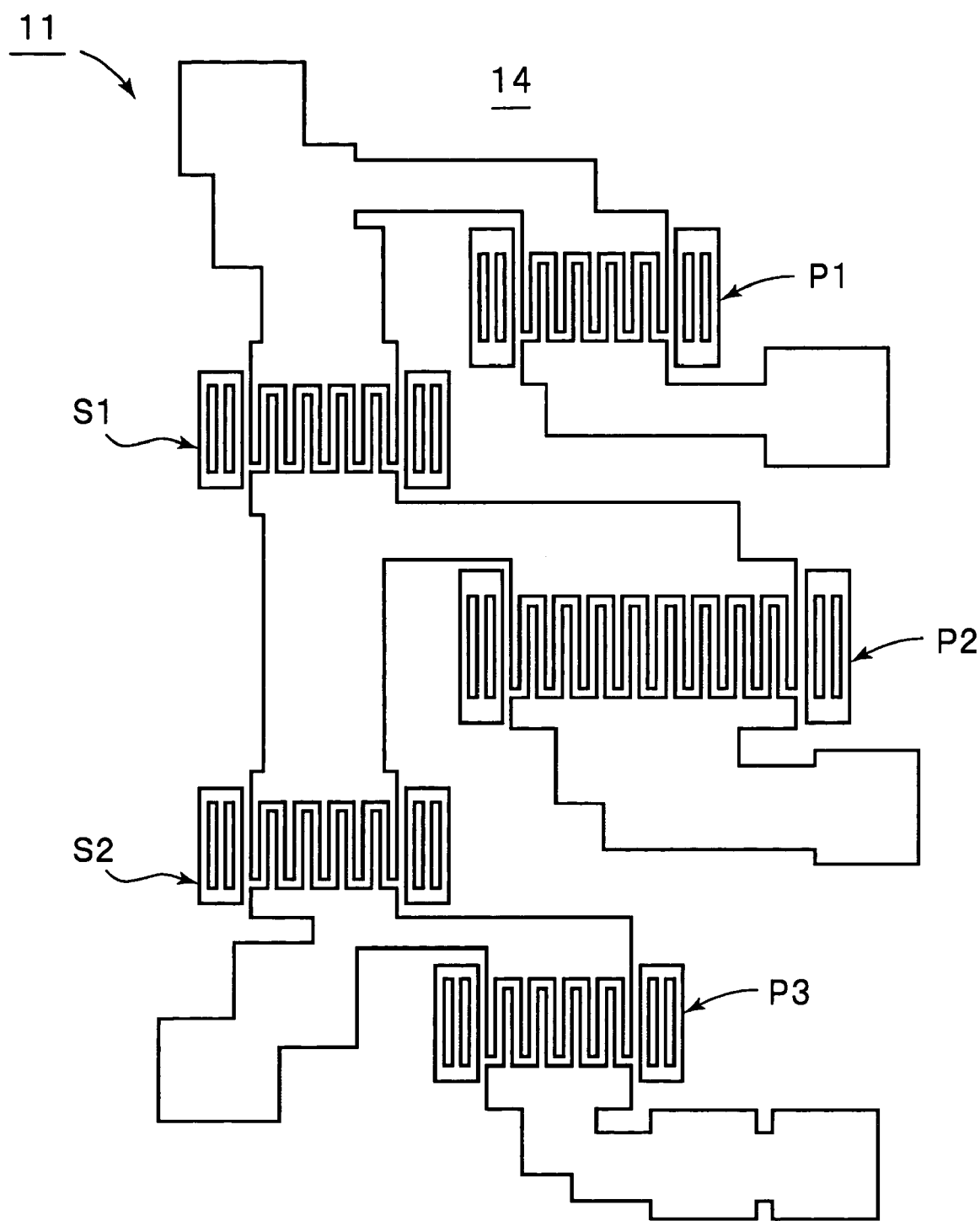
FIG. 4 is a schematic plan view of the ladder type filter as a surface acoustic wave device to which the method of producing a surface acoustic wave device according to a preferred embodiment of the present invention is applied.

FIG. 3 shows a circuit configuration of the ladder type filter to which the present invention is preferably applied, for example. FIG. 4 is a schematic plan view thereof. As shown in FIG. 3, in a ladder type filter 11, series arm resonators S1 and S2 are incorporated in the series arm through which an input terminal 12 and an output terminal 13 are connected to each other. Parallel arm resonators P1 to P3 are arranged in the parallel arms, respectively.

As shown in FIG. 4, in the ladder type filter 11, surface acoustic wave resonators each having one pair of terminals are arranged so that the series arm resonators S1 and S2 and the parallel arm resonators P1 to P3 are arranged on a piezoelectric substrate 14.

According to the present invention, also, in the ladder type filter 11, the insulation film and the bump are preferably formed so that the bonding strengths between the bump and the electrode pad and also between the bump and a package are sufficiently high, as in the above-described preferred embodiment.

Figure 5:
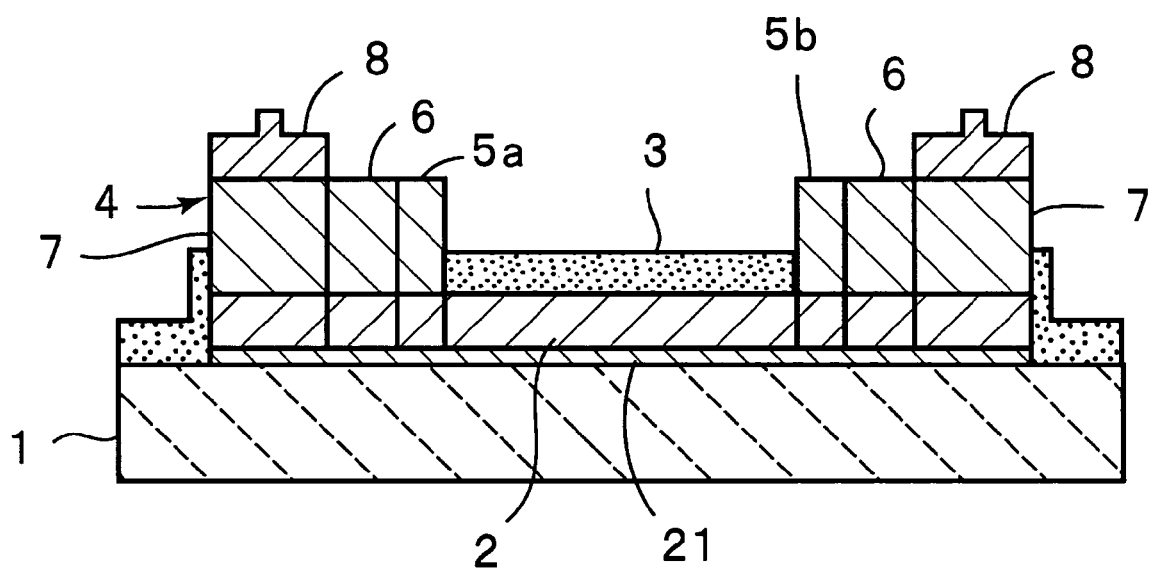
FIG. 5 is a front section view of a modification of the surface acoustic wave device which is provided with the same electrode films.
Figure 6A:
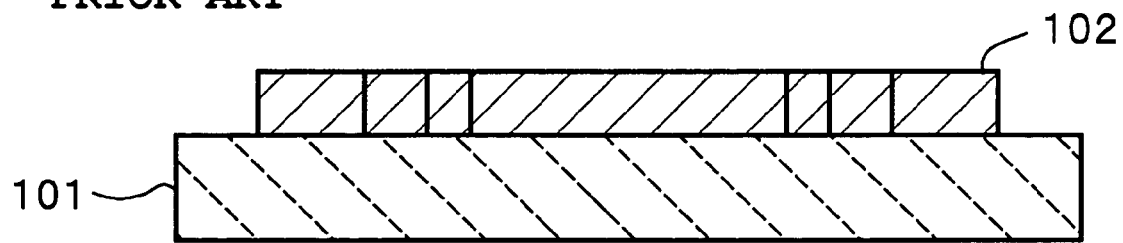
FIGS. 6A, 6B, and 6C are front section views showing an example of known methods of producing surface acoustic wave devices.
Figure 6B:
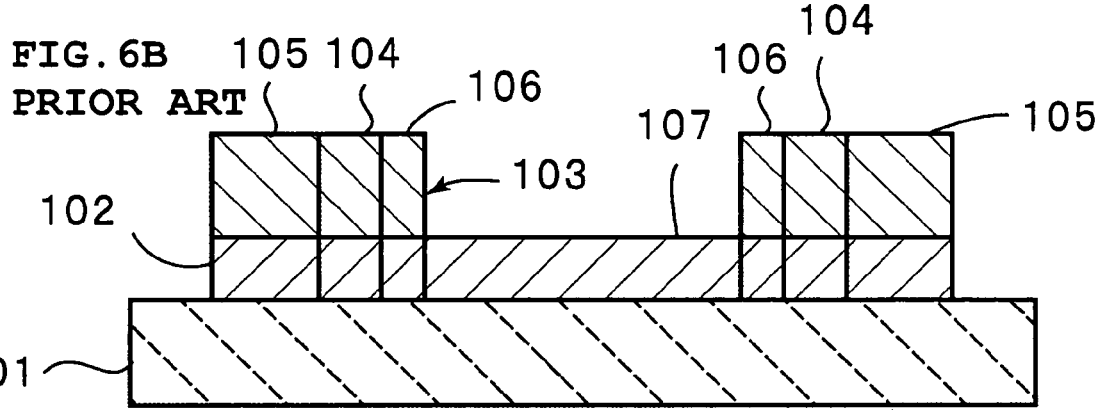
Figure 6C:
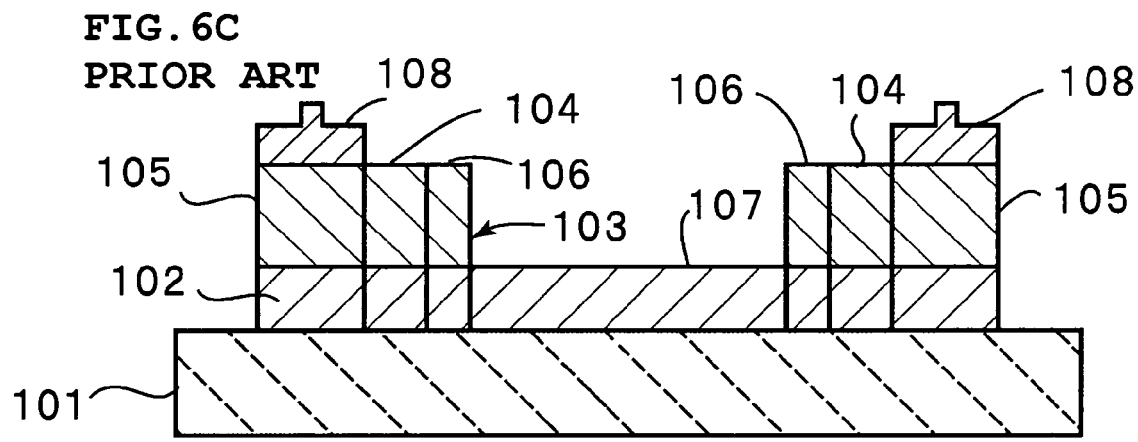
Figure 7A:
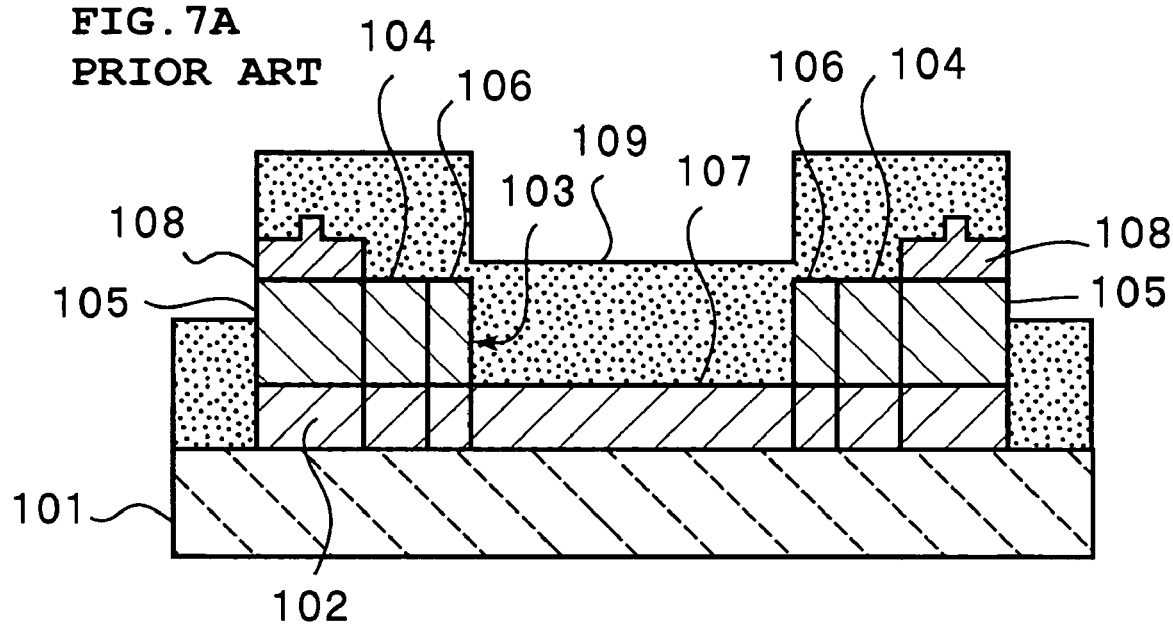
FIGS. 7A, 7B, and 7C are schematic front section views showing the respective steps of the method of producing a surface acoustic wave device which is illustrated in FIGS. 6A to 6C.
Figure 7B:
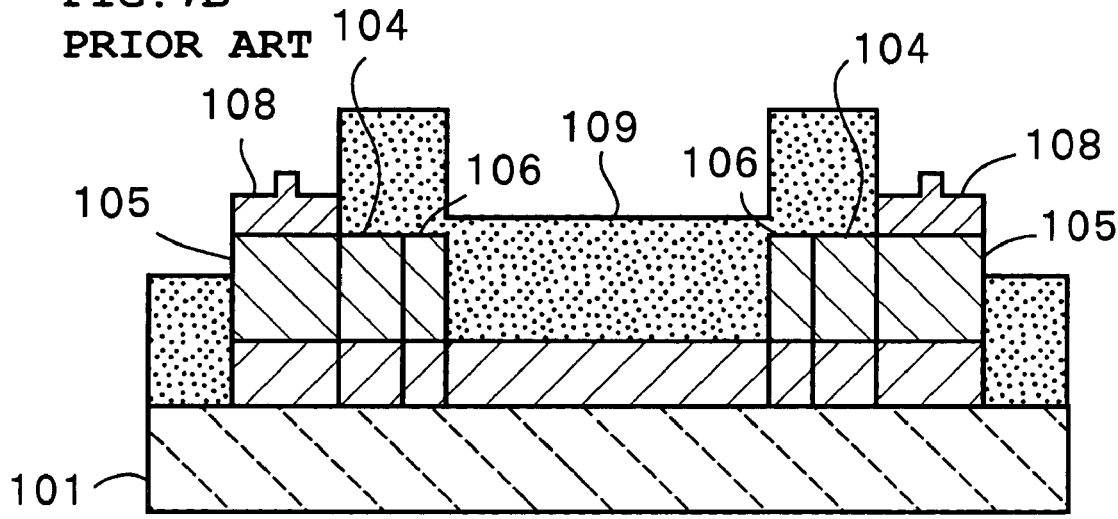
Figure 7C:
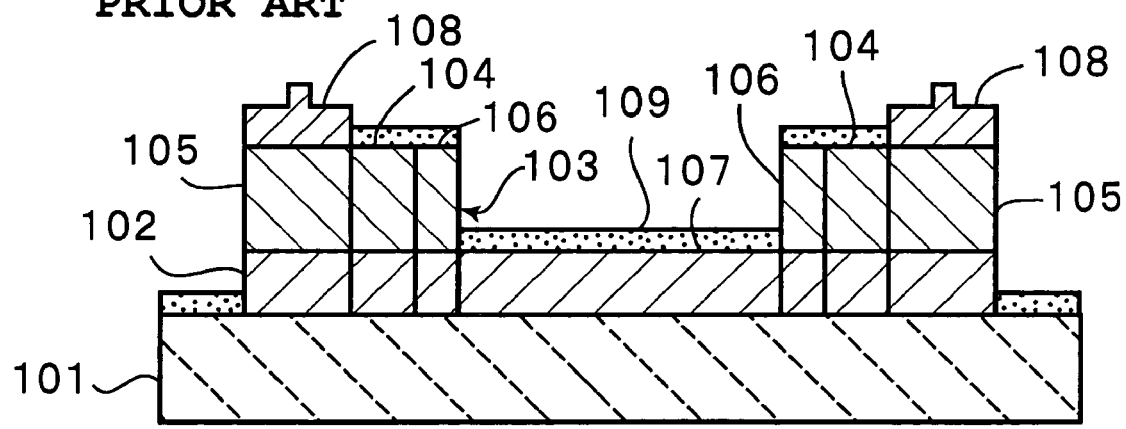
Figure 8A:
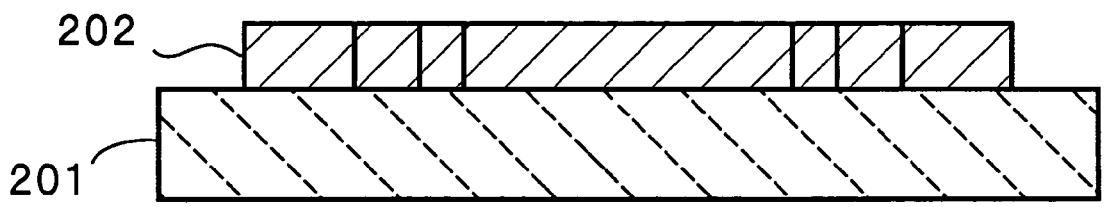
FIGS. 8A, 8B, and 8C are front section views showing another example of the known methods of producing a surface acoustic wave device.
Figure 8B:
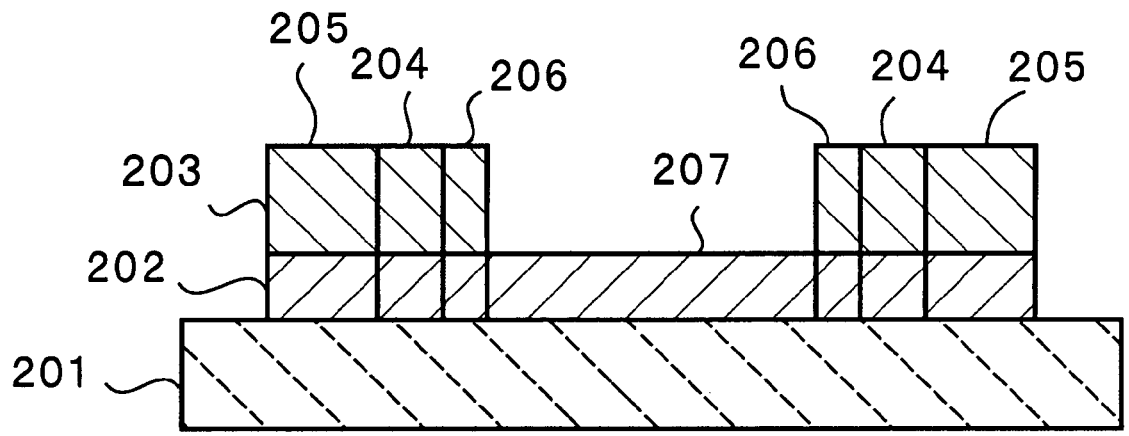
Figure 8C:
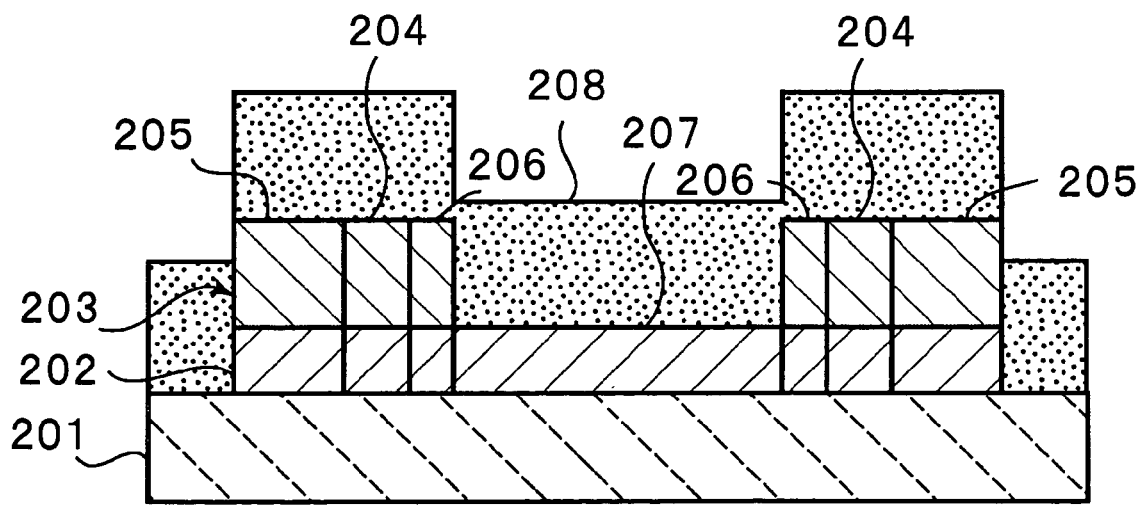
Figure 9A:
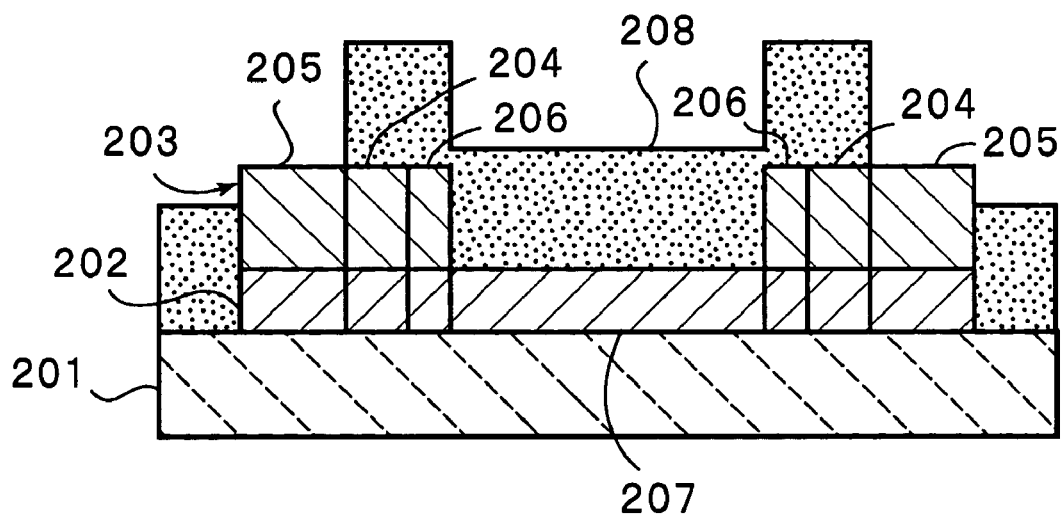
FIGS. 9A, 9B, and 9C are front section views showing a production step for the surface acoustic wave device which is carried out after the steps of the production method shown in FIGS. 8A to 8C.
Figure 9B:
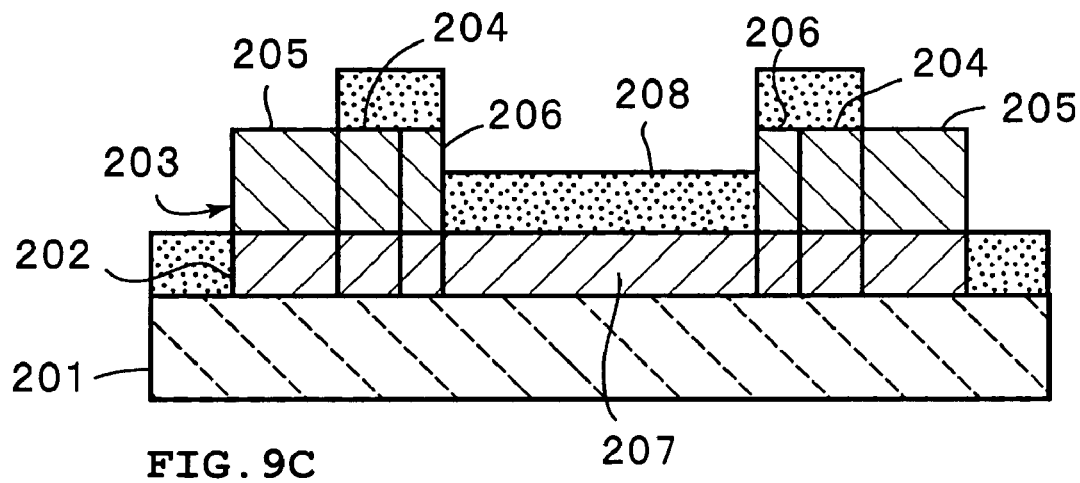
Figure 9C:
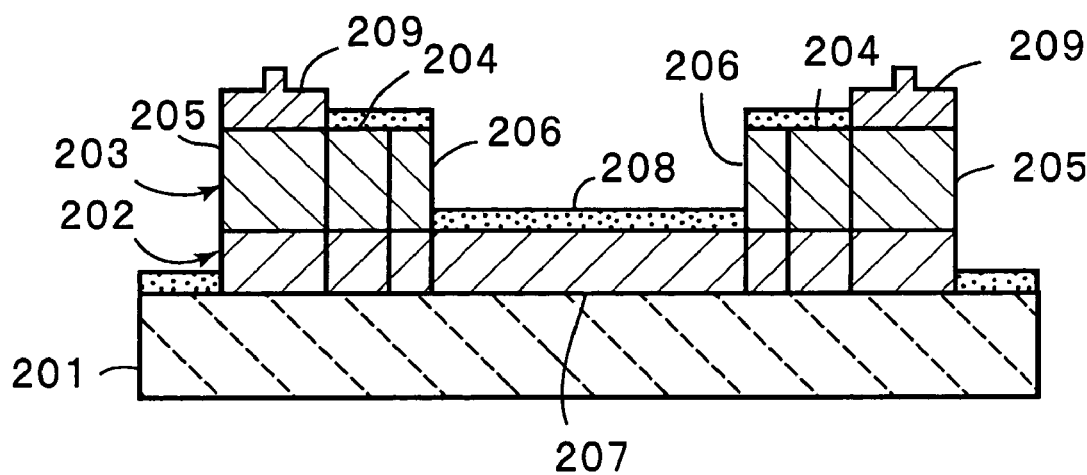

Moreover, according to the above-described preferred embodiment, the second electrode film 4 is laminated on the portion of the first electrode film 2. The electrodes may have a structure including at least three electrode films which are laminated to each other. For example, as shown in FIG. 5, an underlying electrode layer 21 may be formed under the first electrode film 2. Preferably, the underlying electrode layer 21 is formed with an electro-conductive material of which the adhesiveness to the piezoelectric substrate 1 is higher than that of the first electrode film 2. Thereby, the bonding strengths between the electrodes and the piezoelectric substrate can be greatly increased. As an electro-conductive material with which the underlying electrode layer having a superior adhesiveness can be formed, Ti, Cr, NiCr alloys, or other material, are exemplified. Moreover, as an underlying layer for the second electrode film 4, an adhesion electrode layer may be formed. Thereby, the adhesion between the first electrode film 2 and the second electrode film 4 is greatly increased.

Referring to the method of producing a surface acoustic wave device according to this preferred embodiment, in some cases, heat-treatment is carried out in the photolithography and the processes of forming a metal film, a bump, or other process. Thus, undesirably, discharge (pyroelectrical breaking) may occur in a small gap between a signal line and a ground line, due to the pyroelectric effect of the piezoelectric substrate, and defects are generated in the interdigital electrode and the resist. In this case, the following methods are effective: when the interdigital electrode is formed, an electrode on the signal line side and an electrode on the ground line side are shortcircuited to each other, so that the potentials of the respective lines become equal to each other; a small dummy gap is provided, and intentionally, the pyroelectric breaking is caused in the small dummy gap; a piezoelectric substrate that is reduction-treated and having a volume resistivity of about $10^7$ Ω·cm to about $10^{13}$ Ω·cm is used, and so forth. In the case in which the reduction-treated piezoelectric substrate is used, it is not necessary to cut the shortcircuit line in the after-process, and also, countermeasures against pyroelectric breaking are unnecessary. Accordingly, the cost can be reduced by use of the reduction-treated piezoelectric substrate.

Hereinafter, a modification of the production method of this preferred embodiment will be described. In this modification example, first, an underlying electrode made of, e.g., Ti, and a first electrode film made of Al—Cu is formed on a piezoelectric substrate. The underlying electrode and the first electrode film are formed in the area where the interdigital electrode and the wiring electrode are to be formed.

Subsequently, an $SiO_2$ film as an insulation film is formed on the entire surface of the piezoelectric substrate. A portion of the $SiO_2$ film is etched. In this case, the portion of the $SiO_2$ film where the bus bar of the interdigital electrode and the wiring electrode are to be formed, and the portion of the $SiO_2$ film which is formed directly on the piezoelectric substrate and where the second electrode film is to be laminated for formation of the electrode pad are removed. Thereafter, an adhesion electrode layer made of Al—Cu, an electrode layer made of Ti, and the second electrode film made of Al are laminated in the portions of the $SiO_2$ film which have been removed by etching. Thus, the bus bar and the wiring electrode of the interdigital electrode have a structure in which the first and second electrode films, the above-described underlying electrode, and the adhesion electrode layer are laminated. On the other hand, the electrode pad has a structure in which the second electrode film and the adhesion electrode layer are laminated to each other. That is, the electrode pad need not have a structure in which the first and second electrode films are laminated to each other. In this modification, a bump is bonded directly onto the second electrode film. Therefore, the bonding strength between the electrode pad and the bump is greatly increased.

The surface acoustic wave device to which the present invention is applied is not restricted to a ladder type filter. That is, the production method according to the present invention can be applied to different types of surface acoustic wave resonators, longitudinally coupled resonator type surface acoustic wave filters, duplexers using surface acoustic wave elements, and so forth. In addition, the present invention can be applied to a production method for a surface acoustic wave device having no reflector.

According to various preferred embodiments of the present invention, the piezoelectric substrate is preferably made of a piezoelectric single crystal of $LiTaO_3$, $LiNbO_3$, quartz, lithium tetraborate, Langasite, or other suitable material, or piezoelectric ceramics such as lead titanate zirconate type ceramics or other suitable material. The piezoelectric substrate may be produced by forming a piezoelectric thin-film of ZnO or other suitable material on an insulation substrate made of alumina or other suitable material.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A surface acoustic wave device comprising:
   a piezoelectric substrate;
   an electrode disposed on the piezoelectric substrate and including an interdigital electrode, a wiring electrode connected to the interdigital electrode, and an electrode pad;
   a bump bonded to the electrode pad;
   a portion of the electrode including at least the electrode pad having a structure in which plural electrode films are laminated; and
   an insulation film arranged so as to cover an area except for a portion of the electrode having a structure where the plural electrode films are laminated.

2. The surface acoustic wave device according to claim 1, wherein the insulation film is made of one of an $SiO_2$ film and an SiN film.

3. The surface acoustic wave device according to claim 1, further comprising an underlying layer between the piezoelectric substrate and the electrode for increasing adhesion between the piezoelectric substrate and the electrode.

4. The surface acoustic wave device according to claim 1, wherein the electrode includes at least two electrode films.

5. The surface acoustic wave device according to claim 4, further comprising an adhesion electrode layer disposed between the at least two electrode films for increasing adhesion therebetween.

6. A method of producing a surface acoustic wave device comprising the steps of:
- providing a piezoelectric substrate;
- forming a first electrode film for constituting an interdigital electrode, a wiring electrode, and an electrode pad on the piezoelectric substrate, the wiring electrode being in contact with the interdigital electrode, the electrode pad being connected to the wiring electrode, and at least the electrode pad is formed to have a structure in which plural electrode layers are laminated to each other;
- forming an insulation film on the piezoelectric substrate so as to cover the first electrode film;
- patterning the insulation film so that the insulation film existing on a portion of the first electrode film onto which a second electrode film is to be laminated is removed;
- forming the second electrode film on the portion of the first electrode film from which the insulation film has been removed; and
- bonding a bump onto the second electrode film so as to be bonded to the electrode pad.

7. A method of producing a surface acoustic wave device according to claim 6, wherein the portion of the first electrode film onto which the second electrode film is to be laminated includes portions for constituting the electrode pad, the wiring electrode, and a bus bar of the interdigital electrode.

8. A method of producing a surface acoustic wave device according to claim 6, further comprising a step of reducing a thickness of the insulation film for frequency-adjustment after the insulation film is patterned.

9. A method of producing a surface acoustic wave device according to claim 6, further comprising a step of forming one of an $SiO_2$ film and an SiN film as the insulation film.

10. A method of producing a surface acoustic wave device according to claim 6, further comprising a step of forming, as an underlying layer for the first electrode film, an underlying electrode layer for increasing adhesion between the piezoelectric substrate and the first electrode film, and forming the first electrode film on the underlying electrode layer.

11. A method of producing a surface acoustic wave device according to claim 6, further comprising a step of forming, as an underlying layer for the second electrode film, an adhesion electrode layer for increasing adhesion between the first electrode film and the second electrode film, and forming the second electrode film on the adhesion electrode layer.

12. A method of producing a surface acoustic wave device in which an electrode including an interdigital electrode, a wiring electrode in contact with the interdigital electrode, and an electrode pad connected to the wiring electrode is formed on a piezoelectric substrate, at least the electrode pad has a structure in which plural electrode layers are laminated to each other, the method comprising the steps of:
- providing a piezoelectric substrate;
- forming a first electrode film for constituting at least the interdigital electrode and the wiring electrode on the piezoelectric substrate;
- forming an insulation film on the piezoelectric substrate so as to cover the first electrode film;
- patterning the insulation film so that the insulation film existing on a portion of the first electrode film on which a second electrode film is to be laminated, and the insulation film existing on a portion of the piezoelectric substrate onto which the second electrode film for constituting the electrode pad is to be formed are removed;
- forming the second electrode film on the portion of the first electrode film from which the insulation film has been removed and on the portion of the piezoelectric substrate onto which the second electrode film is to be formed; and
- bonding a bump onto the second electrode film constituting the electrode pad so as to be bonded to the electrode pad.

13. A method of producing a surface acoustic wave device according to claim 12, wherein the portion of the first electrode film onto which the second electrode film is to be laminated includes portions for constituting the electrode pad, the wiring electrode, and a bus bar of the interdigital electrode.

14. A method of producing a surface acoustic wave device according to claim 12, further comprising a step of reducing a thickness of the insulation film for frequency-adjustment after the insulation film is patterned.

15. A method of producing a surface acoustic wave device according to claim 12, further comprising a step of forming one of an $SiO_2$ film and an SiN film as the insulation film.

16. A method of producing a surface acoustic wave device according to claim 12, further comprising a step of forming, as an underlying layer for the first electrode film, an underlying electrode layer for increasing adhesion between the piezoelectric substrate and the first electrode film, and forming the first electrode film on the underlying electrode layer.

17. A method of producing a surface acoustic wave device according to claim 12, further comprising a step of forming, as an underlying layer for the second electrode film, an adhesion electrode layer for increasing adhesion between the first electrode film and the second electrode film, and forming the second electrode film on the adhesion electrode layer.

* * * * *